(12) United States Patent
Gerald, II et al.

(10) Patent No.: US 6,774,635 B1
(45) Date of Patent: Aug. 10, 2004

(54) VIDEO TOROID CAVITY IMAGER

(75) Inventors: Rex E. Gerald, II, Brookfield, IL (US); Jairo Sanchez, Chicago, IL (US); Jerome W. Rathke, Homer Glen, IL (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 0 days.

(21) Appl. No.: 10/387,402

(22) Filed: Mar. 14, 2003

Related U.S. Application Data

(60) Provisional application No. 60/398,113, filed on Jul. 25, 2000.

(51) Int. Cl.[7] .................................................. G01V 3/00
(52) U.S. Cl. ........................................ 324/321; 324/318
(58) Field of Search ................................ 324/321, 318, 324/300, 322, 307, 306

(56) References Cited

U.S. PATENT DOCUMENTS 4,958,126 A * 9/1990 Brevard et al. ............. 324/318
5,045,793 A * 9/1991 Rathke ....................... 324/318
6,507,191 B1 * 1/2003 Eguchi et al. ............... 324/318

* cited by examiner

*Primary Examiner*—Louis Arana
(74) *Attorney, Agent, or Firm*—Bradley W. Smith; Mark P. Dvorscak; Paul A. Gottlieb

(57) ABSTRACT

A video toroid cavity imager for in situ measurement of electrochemical properties of an electrolytic material sample includes a cylindrical toroid cavity resonator containing the sample and employs NMR and video imaging for providing high-resolution spectral and visual information of molecular characteristics of the sample on a real-time basis. A large magnetic field is applied to the sample under controlled temperature and pressure conditions to simultaneously provide NMR spectroscopy and video imaging capabilities for investigating electrochemical transformations of materials or the evolution of long-range molecular aggregation during cooling of hydrocarbon melts. The video toroid cavity imager includes a miniature commercial video camera with an adjustable lens, a modified compression coin cell imager with a fiat circular principal detector element, and a sample mounted on a transparent circular glass disk, and provides NMR information as well as a video image of a sample, such as a polymer film, with micrometer resolution.

8 Claims, 11 Drawing Sheets

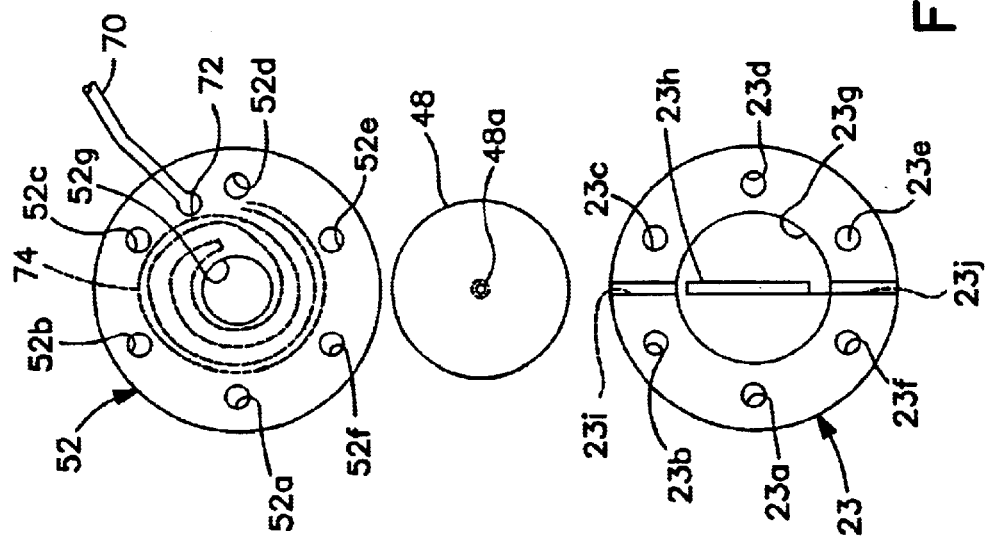
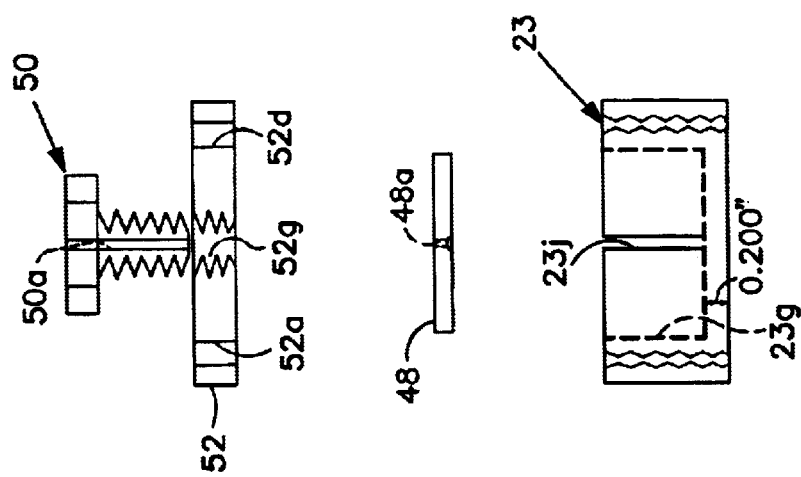
FIG. 5
FIG. 4

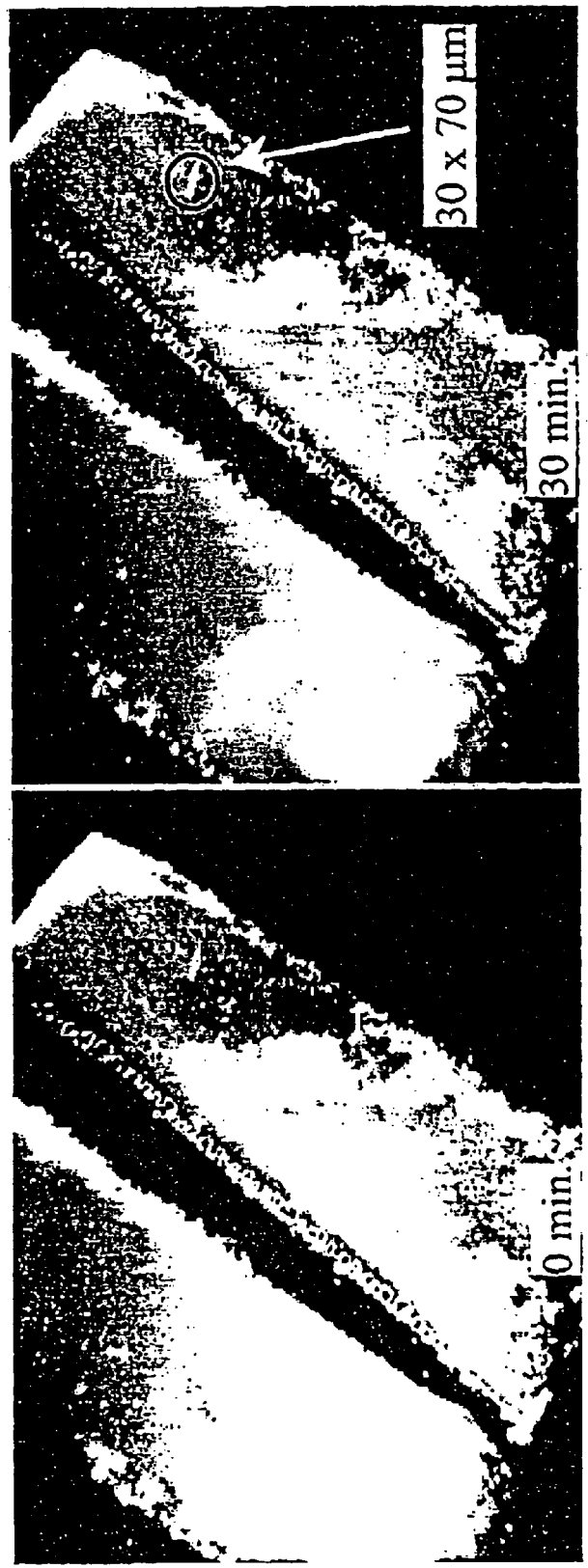

VIDEO TOROID CAVITY IMAGER

This application claims priority to U.S. Provisional Patent Application No. 60/398,113 filed on Jul. 25, 2002.

CONTRACTUAL ORIGIN OF THE INVENTION

The United States Government has rights in this invention pursuant to Contract No. W-31-109-ENG38 between the U.S. Department of Energy and the University of Chicago.

FIELD OF THE INVENTION

This invention relates generally to apparatus for the non-invasive, real-time nuclear magnetic resonance (NMR) spectroscopy and video imaging of materials and is particularly directed to in situ measurement of electrochemical properties of an electrolytic material using a modified toroid cavity detector (TCD), a video detector, and an arrangement for the acquisition of the NMR and video data.

BACKGROUND OF THE INVENTION

Spectroscopic tools such as nuclear magnetic resonance (NMR), Fourier transform infrared (FTIR), electron paramagnetic resonance (EPR), and ultraviolet/visible spectroscopy (UVNIS) provide insight into the atomic connectivities, architecture, dynamics, and electronic multiplicity in molecules. The data that these tools generate is in the form of spectrographs, which are signatures of the electronic structure that binds atoms together to form molecules. Spectrographs are interpreted using models, compared to standards, and simulated by ab initio calculations to reveal or corroborate atomic structure in molecules. Spectroscopic tools operate at a molecular level to analyze bulk materials that are typically in an isotropic powder or liquid form. Crystalline and lamellar materials exhibit long-range order in one or more spatial dimensions when crystallized from solution or cooled from a melt. Several spectroscopic and imaging devices have examined molecular aggregation during the formation of long-range microscopic order in a sample. Gravitational, magnetic, and electric fields have been used to influence the direction of molecular aggregation. The patterns in NMR spectrographs change according to the orientation that a sample with long-range order has in the applied external magnetic field. A device that can simultaneously photograph microscopic molecular aggregation under the influence of a force field (and variable conditions of temperature and pressure) and record spectroscopic information in situ would establish a direct, unambiguous connection between spectrographic and image data of long-range molecular order. One of these types of devices is a video toroid cavity imager which operates in the presence of a large applied magnetic field, under controlled temperature and pressure, to provide simultaneous NMR spectroscopy and video imaging capabilities for investigating the evolution of long-range molecular aggregation. In the new nanotechnology field, the video toroid cavity imager can play an important role in characterizing and investigating the formation and properties of macroscopic thin films that are organized on the molecular level.

An earlier apparatus employing NMR imaging to provide in situ measurements of electrochemical properties of a sample and including a cylindrical toroid cavity resonator is disclosed in U.S. Pat. No. 6,046,592 to Rathke et al. This apparatus includes a cylindrical electrochemical cell 32 disposed within a sealed toroid cavity resonator 12 constructed from a material having a good electrical conductivity. A metal rod defines the axis of the cylindrical device and serves as the working electrode of the cell and the central conductor of the toroid cavity NMR detector. A glass tube surrounds the central conductor and contains the sample. A helical coil is disposed within the glass tube and is used as a counter electrode. Attached in a threaded manner to one end of the toroid cavity resonator 12 is a toroid cavity end cap 26 having a single compression fitting 28 which serves to pass the working electrode 20 from a NMR spectrometer 44 through the toroid cavity end cap 26 to the base 31 of the electrochemical cell compartment 32. Two compression fittings 16 and 18 on the opposed end of the toroid cavity 12 serve to pass electrodes 20 and 22 to a potentiostat 42 for charging the electrodes as shown in FIG. 2. The geometry of this arrangement is limiting in terms of making measurements of the flat circular components of a coin cell battery.

Another approach to the design of a toroid cavity detector for NMR analyses is disclosed in U.S. Pat. No. 6,469,507 to Gerald II et al. This imaging apparatus offers the advantage of maintaining the sample adjacent to or in contact with a principle detector element 238 which is in the form of flat metal conductor, the plane of which is parallel to the longitudinal axis of the toroid cavity 42. This arrangement is convenient because flat anode laminates, polymer electrolyte films, and cathode laminates are routinely prepared, and can be easily stacked and compressed to facilitate their incorporation and use in this apparatus for analyzing coin cells using wide line multinuclear-NMR spectroscopy and imaging. The sample is subjected to NMR analyses when a static main homogenous magnetic field ($B_0$) produced by a NMR magnetic device is applied to the toroid cavity 42 and a radio frequency (RF) excitation signal pulse is provided to the principle detector element 238 so that an alternately energized and de-energized magnetic field ($B_1$) is produced in the sample and throughout the toroid cavity.

The present invention addresses the aforementioned limitations of the prior art by providing a toroid cavity detector for use in NMR analyses of a sample which provides recorded video images of the sample.

OBJECTS AND SUMMARY OF THE INVENTION

Accordingly, it is an object of the present invention to provide apparatus for simultaneously photographing microscopic molecular aggregation under the influence of a force field while recording spectroscopic information in situ to determine the relationship between image and spectroscopic data of long-range molecular order.

It is another object of the present invention to provide apparatus for investigating and characterizing the formation and properties of macroscopic thin films that are organized on the molecular level.

A further object of the present invention is to provide for the real-time in situ spectral analyses of the electronic structure that binds atoms together to form molecules and optical analyses of microscopic molecular aggregation of materials under the influence of a force field during the formation of long-range molecular order.

A still further object of the present invention is to provide an improved compression coin cell battery imager for the in situ electrochemical analyses and evaluation of the electrodes of a sealed battery using NMR and optical techniques.

This invention contemplates a toroid cavity detector cell for in situ analyses of a sample through the use of nuclear magnetic resonance, wherein the sample includes plural stacked components, the toroid cavity detector cell comprising: a housing having a cylindrical recessed portion therein; a removable cover plate attached to the housing and disposed over the cylindrical recessed portion to form a closed toroid cavity; a detector disposed in the closed toroid cavity and containing the sample, as well as an electrolyte; a piston arrangement attached to the cover plate for applying increased pressure on the detector cell for ensuring mechanical contact between the stacked components in the sample, hermetically sealing the electrolyte and sample within the detector cell, and uniform application of the magnetic field to the plural stacked components in the sample.

The present invention is further directed to a toroid cavity apparatus for in situ analyses of a sample through the use of nuclear magnetic resonance and optical inspection, the toroid cavity apparatus comprising: a closed housing forming a toroid cavity, wherein the housing is disposed in an externally applied magnetic field $B_0$, and contains a sample to be analyzed; a detector cell disposed within the toroid cavity containing the sample; an NMR spectrometer electrically coupled to the detector cell for producing an alternately energized and de-energized magnetic filed $B_1$ through the toroid cavity and within the sample for the spectroscopic analyses of the sample; a laser or incandescent light source coupled to the toroid cavity for directing laser or white light, respectively, onto the sample; and a video camera coupled to the toroid cavity and focused on the sample for viewing and recording the appearance of the sample.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

FIG. 4 is an exploded lateral sectional view of a coin cell battery imager for use in the video toroid cavity imager of the present invention;

FIG. 5 is a plan view of the elements of the coin cell battery imager shown in FIG. 4;

FIGS. 12a and 12b are video images of a test sample of cellophane tape fragments taken at 0 min. and 30 min., respectively, which demonstrate the stability of the video camera in the magnetic field within the video toroid cavity imager of the present invention.

DETAILED DESCRIPTION OF THE PREFERRED EMBODIMENTS

In accordance with these and many other objects of the present invention, the inventive toroid cavity imager includes a detector cell having an outer cylindrical housing with a top and base portion which form a cylindrical cavity. A first electrical conductor extends from a potentiostat through the housing to a principal detector element (for example, an alloy disk or a carbon coated metallic disk). A second electrical conductor also extends from the principal detector through the housing to an NMR spectrometer. The principal detector element is a flat conductor comprised of copper or a transparent conductive glass such as indium tin oxide. In order to analyze a sample held adjacent to or in contact with the principal detector element within the housing, the housing is placed in an externally applied static main homogeneous magnetic field ($B_0$) produced by a NMR magnetic device, the magnetic field being oriented perpendicular or parallel, or at any desirable angle, to the surface normal of the principal detector element. The presence of the magnetic field causes the magnetic moments of a targeted class of nuclei in the sample to precess about the field's axis at a rate which is dependent on the magnetic field strength. An RF excitation signal pulse is provided through the second electrical conductor and the principal detector element from a NMR spectrometer such that an alternately energized and de-energized magnetic field ($B_1$) is produced in the sample and through the toroid cavity. This $B_1$ field is oriented perpendicular to the $B_0$ field and causes transitions between adjacent (allowed) or non-adjacent (nonallowed) magnetic energy levels of electronic or nuclear origin. The resulting fluctuating magnetic and/or electric fields emanating from the sample induce alternating signal currents in the principal detector element which are detected during, after or interspersed with the application of the alternating excitation signal pulse. The detected signals are recorded by an analog-to-digital converter with a high sampling rate, stored in a computer and analyzed for quantitative speciation (elemental/chemical composition) of different nuclides. Quantitative speciation can be obtained for the bulk sample or as function of the position of the sample away from the surface of the principal detector element in the direction normal to the surface of the principal detector element.

Figure 1:
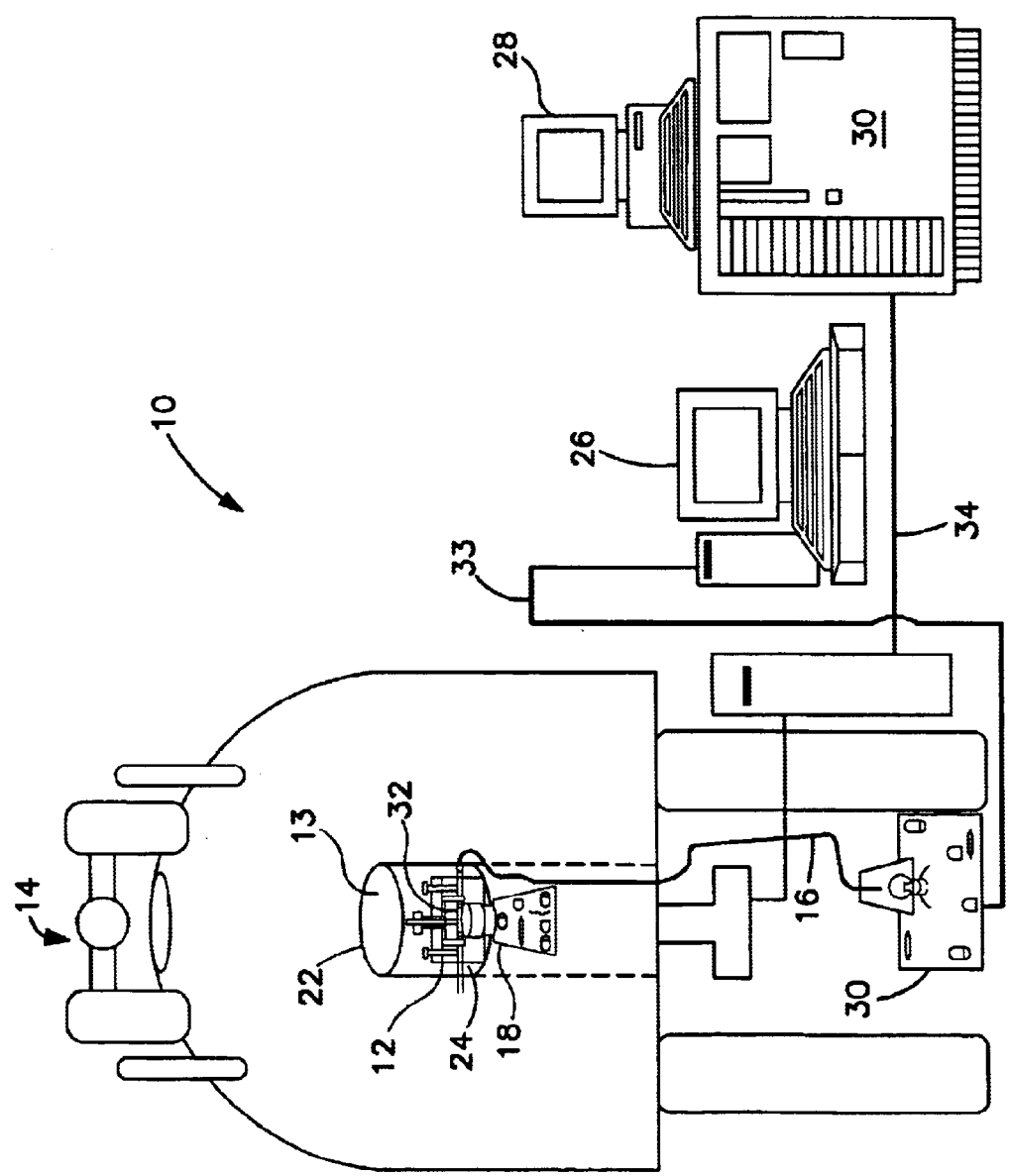
FIG. 1 is a simplified combined block and schematic diagram of a video toroid cavity imager in accordance with the principles of the present invention.

Referring to FIG. 1, there is shown a simplified combined schematic and block diagram of a video toroid cavity imager 10 in accordance with the present invention. The video toroid cavity imager 10 includes a toroid cavity detector cell 22 disposed within a magnetic field 13. A magnet 14 surrounds the magnetic field 13. Disposed within the toroid cavity detector cell 22 is a compression coin cell container 12 which contains the sample specimen 32 for analyses. NMR detector leads 24 are coupled to an NMR detector element within the compression coin cell container 12. The sample 32 under analyses is irradiated by a laser or white light beam provided to the compression coin cell container 12 via a fiber optic cable 16 by a laser or incandescent light source 20, respectively. A video camera 18 disposed within the magnetic field 13 and immediately adjacent the compression coin cell container 12 records video images of the sample 32 undergoing analyses and provides this information via data cable 34 to a NMR console 30 which operates under the control of a computer 28. The laser or incandescent light source 20 is coupled via data cable 33 to and operates under the control of a video imaging computer 26.

Figure 2:
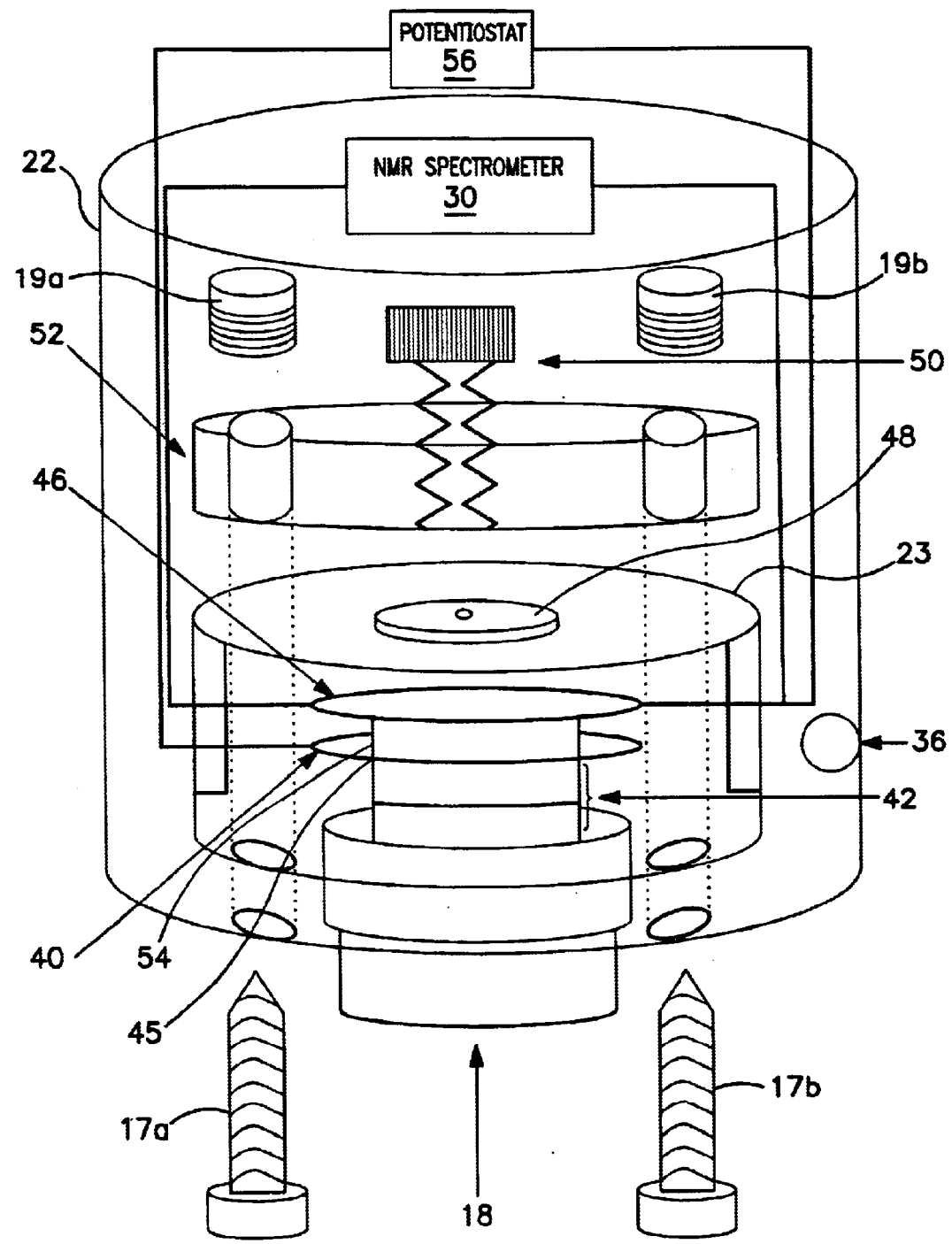
FIG. 2 is a lateral perspective view shown in simplified schematic diagram form of a toroid cavity device for use in the video toroid cavity imager of the present invention.
Figure 2A:
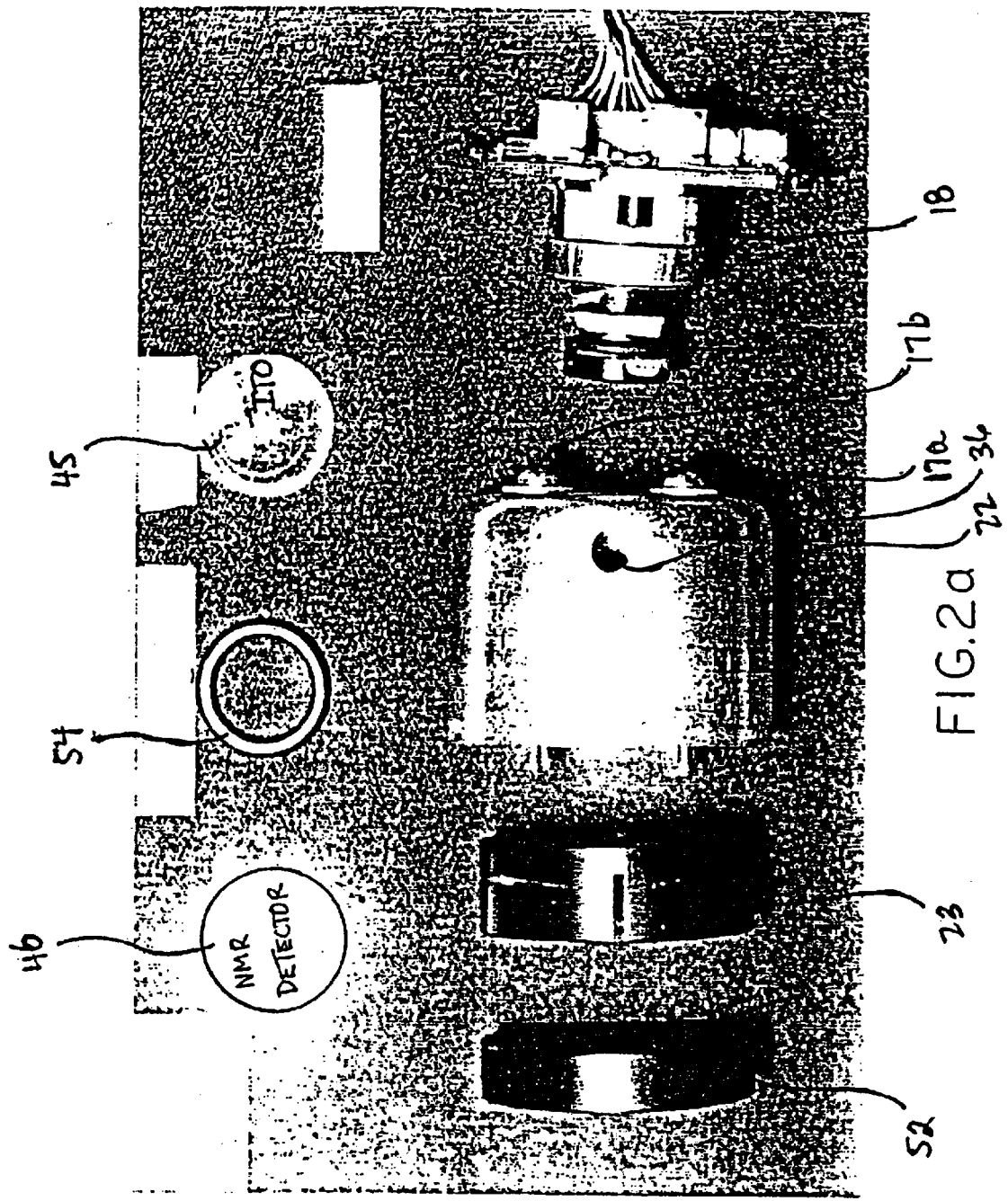
FIG. 2a is an exploded side view photograph of the video toroid cavity imager of the present invention.
Figure 3:
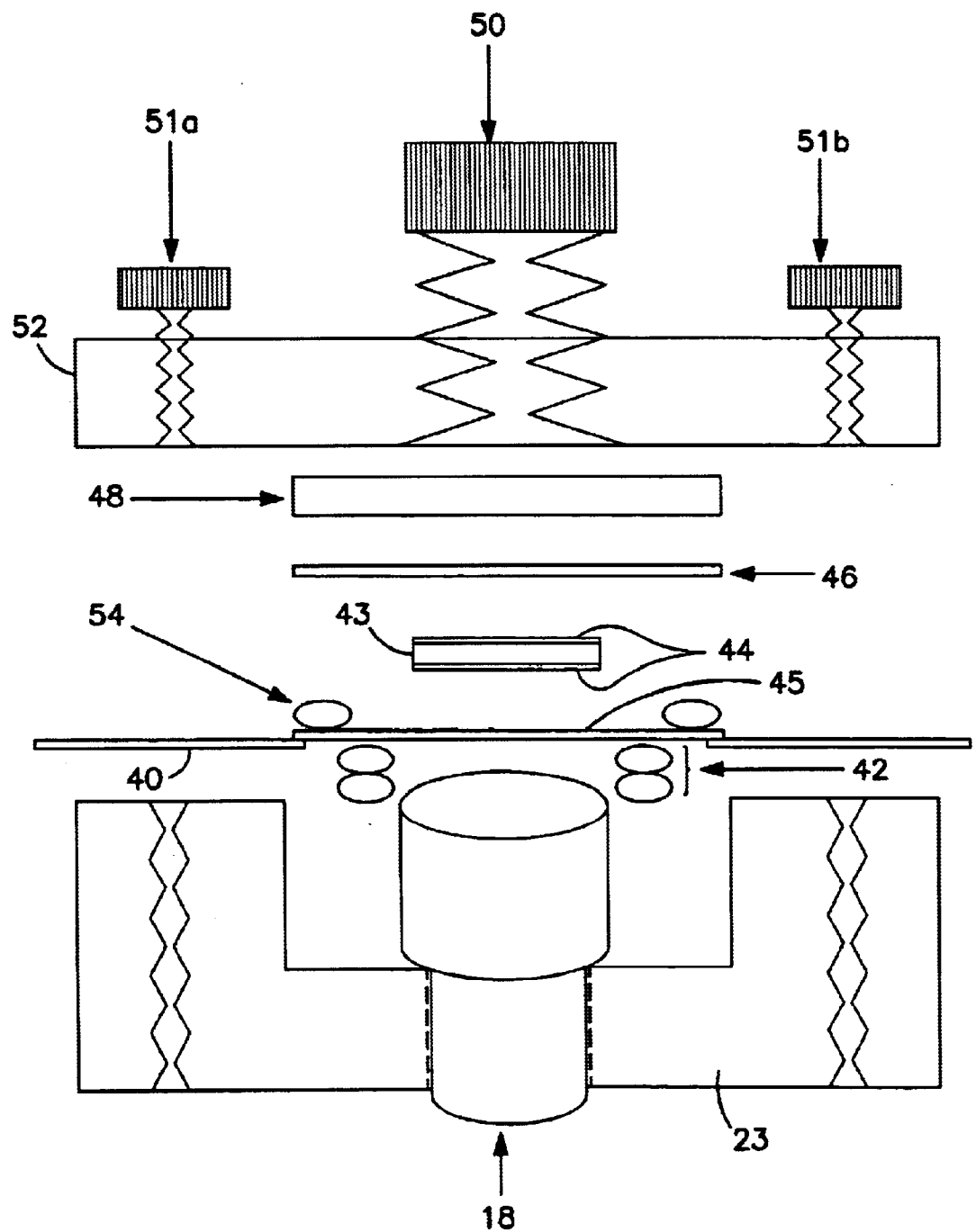
FIG. 3 is a simplified lateral sectional view of the toroid cavity device shown in FIG. 2.

Referring to FIGS. 2 and 2a, which are respectively lateral perspective and exploded photographic side views of the toroid cavity detector cell 22, additional details of the video toroid cavity imager will now be described. FIG. 3 is a simplified lateral sectional view of the various components within the toroid cavity detector cell 22. The toroid cavity detector cell 22 includes a plastic holder assembly 23 to minimize $B_0$ distortions. Compressing an O-ring gasket 54 hermetically seals the components in a liquid electrolyte within the toroid cavity detector cell 22. This compression also facilitates mechanical contact between the stacked components within the toroid cavity detector cell 22 so that an external electrochemical potential is uniformly applied to the battery's electrodes within the detector. Using this device, NMR spectroscopy and imaging experiments can be used to analyze electrochemical insertion of lithium into commercially available graphite film anodes under in situ conditions. This imaging capability allows the two battery electrodes to be independently analyzed. For the evaluation of the electrochemical characteristics, coin-type cells are assembled within an electrode diameter of 0.625 in. The high NMR sensitivity of the toroid cavity detector cell 22 allows observation of naturally abundant $^7$Li with electrode samples as small as 9 mg of the active carbon. Galvanostatic cycling can be performed between 1.5 V and 0.0 V. Constant charge and discharge current was fixed in the measurements describe hereafter at 0.1 milliamps. Other voltage ranges and current values may be chosen for different analyses.

The samples tested by the present invention consisted of components from a lithium-ion battery which were hermetically sealed in the toroid cavity detector cell 22. The toroid cavity detector cell 22 includes the aforementioned plastic holder assembly 23 and cover assembly 52 attached together using six thumb screws (51a and 51b shown) or six machine screws (17a and 17b shown) and six machine hex nuts (19a and 19b shown), a mechanical press assembly including a piston 48, an O-ring seal 54, a circular principle detector element, or NMR detector 46, and a glass disk electrode 45. Compressing the O-ring gasket 54 by turning thumb screw 50 hermetically seals the components and a liquid electrolyte. Variable compression insures uniform mechanical pressure between the NMR detector 46, the glass electrode disk 45, the separator 43, and the electrolyte so that the external electrochemical potential applied by potentostat 56 is evenly applied to the electrode material sample to be analyzed 44, i.e., the battery electrode surfaces. Electrical contact is made to the glass disk electrode 45 by a ring electrode 40. Using this device, NMR spectroscopy and imaging experiments employing NMR spectrometer 30 were used to analyze electrochemical insertion of lithium into commercially available graphitic carbon anodes under in situ conditions.

The compression coin cell container 12 is disposed within the toroid cavity detector cell 22. An electronic video camera 18 is attached to the back of the cell, which forms the bottom part of the compression coin cell container, by six machine screws, two of which are shown as elements 17a and 17b, and machine hex nuts, two of which are shown as elements 19a and 19b in FIGS. 2 and 2a. Video camera 18 is mounted under and aimed at the glass disk electrode 45 within the compression coin cell container 12 and is interfaced with the aforementioned video imaging computer 26 for image processing and storage via a long non-magnetic shielded multi-conductor cable 33. Principal detector element, or NMR detector 46 is mounted opposite the video camera 18 and is interfaced with the aforementioned NMR console 30 and computer 28 for NMR spectroscopy data processing and storage via a long non-magnetic shielded multi-conductor cable 34.

The toroid cavity detector cell 22 is preferably comprised of copper and is cylindrically shaped. The plastic holder assembly 23 within the toroid cavity detector 22 is preferably comprised of Ultem plastic. The plastic holder assembly 23 is 1.5 in. In outside diameter and 0.5 in. high, while the toroid cavity detector 22 has an inner diameter of 1.614 in. and an inner height of 1.276 in. Two Viton O-rings 42 protect the lens of the electronic camera 18 and form a pressure seal between the camera's lens and the glass disk electrode 45. The Teflon O-ring 54 is disposed above the glass disk electrode 45 which may be comprised of copper sputtered on glass, but is preferably comprised of a transparent conductive glass such as indium tin oxide (ITO). A copper disk NMR detector electrode 46 is disposed above and in sealed contact with the Teflon O-ring 54. An aperture 36 within the toroid cavity detector cell 22 is used as a light port for the fiber optic cable 16 which is coupled to the laser or incandescent light source 20. The top part of the compression coin cell container 12 within the toroid cavity detector 22 has the same outside diameter as its bottom portion.

Referring to FIG. 4, there is shown an exploded lateral sectional view of the plastic holder assembly 23 and piston 48 combination disposed within the toroid cavity detector cell 22. Plan views of each of the components of this arrangement including the plastic holder assembly 23, its top cover plate 52, and a piston 48 disposed within the assembled plastic holder and top cover plate combination are shown in FIG. 5. Top cover plate 52 and plastic holder assembly 23 each have six spaced, aligned apertures for securely attaching the top cover plate to an upper portion of the plastic holder assembly by means of six threaded screws each inserted through aligned apertures within the top cover plate and the plastic holder assembly. Thus, top cover plate 52 is provided with six apertures 52a–52f which are respectively aligned with apertures 23a–23f in an upper surface cover for the plastic holder assembly 23. The six apertures in the plastic holder assembly 23 are threaded to facilitate attachment of the top cover plate 52 to the plastic holder assembly by means of six screws (not shown for simplicity). Plastic holder assembly 23 further includes an inner cylindrical recessed portion 239, while the top cover plate 52 includes a threaded center aperture 52g. Center aperture 52g is adapted to receive in threaded engagement a large diameter screw 50 having a linear, cylindrical bore 50a extending therethrough. The large diameter screw 50 is inserted through the threaded center aperture 52g within the top cover plate 52 so as to engage an upper surface of the piston 48 and displace the piston downwardly within the cylindrical recess 23g in the plastic holder assembly 23. Piston 48 also includes a center bore 48a aligned with the cylindrical bore 50a extending through the large diameter screw 50. A counter or working electrode wire (not shown) extends through the screw's bore 50a as well as through the piston's bore 48a so that it can make electrical contact to the coin cell battery NMR electrode 46.

The electronic camera 18 is closely positioned beneath the glass disk electrode, 45. The glass disk electrode 45 is preferably in the form of an indium tin oxide (ITO) window, which is a conductive transparent glass, but may also be comprised of copper sputtered on glass. The two Viton O-rings 42 are positioned so as to facilitate the application of pressure between the lens of the electronic camera 18 and the glass disk electrode 45 and the plastic holder assembly 23. O-ring 54 is disposed about the components of the battery sample 43, 44 and forms a hermetic seal around the sample. O-ring 54 is preferably comprised of Teflon. The sample to be analyzed 44 is located above the glass disk electrode 45, and a copper disk NMR detector electrode 46 is positioned above the sample. The copper disk NMR detector electrode 46 has threaded apertures (not shown for simplicity) where threaded wire posts can be attached. These wire posts connect the NMR detector electrode 46 to a potentiostat 56, and also to an NMR spectrometer 30. Rectangular grooves 23i and 23j facilitate placement of coin cell battery NMR electrode 46, having two wire post connectors extending from its perimeter in opposite directions, into plastic holder assembly 23. Piston 48 is preferably comprised of plastic and is disposed immediately above the copper disk NMR detector electrode 46. Application of pressure to the piston 48 by the large diameter screw 50 results in the application of pressure on the battery sample to be analyzed 43, 44. The large diameter screw 50 permits the pressure on both the cell seal comprised of the aforementioned O-rings and the cell electrodes to be simultaneously increased. Control of the pressure on the battery sample 43, 44 is very important because it keeps the active cell components and a liquid electrolyte contained within the Teflon O-ring housing intact and prevents the test cell components from contacting oxygen, nitrogen, and water in the ambient air. Increasing pressure on the Teflon-coated O-ring 54 results in an increase in the pressure on the electrodes of the battery sample 43, 44 and prevents evaporation of the electrolytes in the test cell over an extended period which was a problem in prior test cell arrangements. In a preferred embodiment, the large diameter screw 50 is a hex head screw or a thumb screw which is adapted for tightening by means of a wrench or pliers or by hand to apply a large pressure to piston 48. The top cover plate 52 is preferably comprised of a high strength non-magnetic stainless steel and includes the aforementioned cylindrical bore 52g having 20 threads/inch which has proven to be highly resistant to cross threading, while providing good control of the applied pressure. The large diameter screw 50 is preferably comprised of brass.

In order to form a long-lasting hermetic seal in the toroid cavity detector cell 22, a large pressure must be applied to the Teflon O-ring 54 by the copper disk NMR detector electrode 46 and the glass disk electrode 45. This high pressure requirement is likely due to the rough grooved surfaces of the NMR detector electrode 46 and imperfections on the glass disk electrode 45. In some experiments, grease was applied to the Teflon O-ring 54 to fill the grooves in the electrodes, but this proved to be only a temporary solution as the grease was dissolved by the electrolyte. In order to enhance the contact between these current collecting electrodes and the Teflon O-ring 54, the facing surfaces of the NMR detector electrode 46 and glass disk electrode 45 were polished using a vibratory polishing machine to provide the smooth surfaces necessary for a long-lasting hermetic seal.

Finally, as shown in FIG. 5 the circular top cover plate 52 disposed on the plastic holder assembly 23 has an aperture 72 in its upper surface. An electrical cable 70 coupled to a source of electrical energy (not shown for simplicity) is inserted through the aperture 72 and extends into the top cover plate 52 which is hollow. The electrical cable 70 is connected to a heating coil 74 (shown in dotted line form) disposed within the top cover plate 52 and about the center aperture 52g therein. Heating coil 74 allows the temperature of a sample material within the plastic holder assembly 23 to be increased during testing and evaluation of the sample, as desired.

Figure 6:
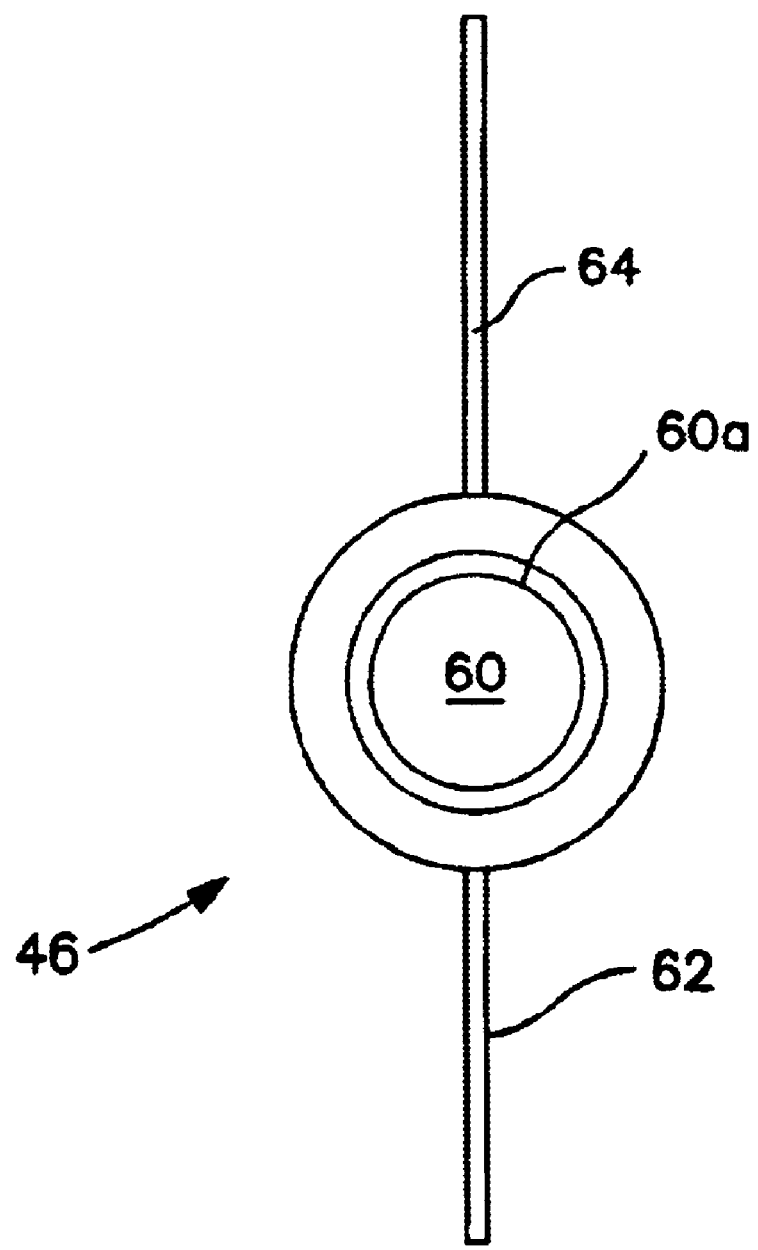
FIG. 6 is a plan view of the principle detector element used in the video toroid cavity imager of the present invention.

The NMR detector electrode 46 serves as the NMR inductor and battery circuit current collector. The NMR detector electrode 46 includes a solid copper disk 60 forming part of the central conductor within the NMR detector circuit as shown in the plan view of FIG. 6. The copper disk 60 includes a circular groove 60a in its upper surface to receive the Teflon O-ring 54 described above for an improved seal. Attached to opposed portions of the copper disk 60 are first and second electrical leads 62 and 64. In some cases, an electrode in the form of a carbon film or carbon disk is placed on the copper disk 60 of the NMR detector electrode 46. The first and second copper electrical leads 62, 64 are inserted into the bottom and top perimeter edges, respectively, of the copper disk 60 as viewed in FIG. 6 to provide electrical contact. The copper disk NMR detector electrode 46 disposed above the Teflon O-ring 54 is preferably provided with a circular groove to receive the Teflon O-ring to form an improved vacuum seal. As shown in FIG. 5, the bottom surface of the cylindrical recess 23g in the plastic holder assembly 23 is provided with an elongated, linear groove, or slot, 23h for receiving a reference sample. Opposed lateral portions of the plastic holder assembly 23 further include respectively linear square grooves 23i and 23j (shown in dotted line form in FIG. 5) which are in common alignment and extend inwardly from the outer surface of the plastic holder assembly to its inner cylindrical recess 23g. As stated previously, rectangular grooves 23i and 23j facilitate placement of coin cell battery NMR electrode 46, having two wire post connectors extending from its perimeter in opposite directions, into plastic holder assembly 23.

In the early 1970's, it was discovered that intercalation compounds (carbon materials) could be used as electrodes in secondary Li batteries. Hundreds of carbons are commercially available. These include: cokes, fibers, mesocarbons, and synthetic and natural graphites. Furthermore, special carbon with selected additives, dopants or substituents can also be prepared and show promise in battery applications. The video toroid cavity Imager of the present invention is capable of analyzing new and emerging electrode materials for the next generation of batteries. Electrochemical insertion of lithium into commercially available graphite film anodes, electrochemical insertion into a novel Ag-coated anode material, and electrochemical transport of lithium into a solid state electrolyte are a few of the applications of the present invention in battery research.

An intercalation 'host' is a solid, which can reversibly incorporate 'guest' atoms or molecules within its crystal lattice with only small structural changes. The maximum amount of lithium that can be intercalated into graphite is 1 per 6 carbons, yielding a specific capacity of 0.372 Ahr/g. An average reversible specific capacity of approximately 0.310 Ahr/g is typically achieved in practice. The cycling efficiency of commercially available graphite film anodes will depend on the formation of dendrites at the electrode surface, the degradation of reversible capacity with cycle number, and the intercalation mechanism of lithium ions in carbon electrodes. In one application example, the formation of needle-like lithium metal dendrites can be Imaged in situ using the present invention.

Several modifications of the basic design of carbon lithium-intercalating anodes with copper current collectors in rechargeable lithium-ion electrochemical cells have been proposed. These modifications are intended to prevent or a least retard the internal short-circuiting and consequent premature failure that can be caused by lithium dendrites. A rechargeable lithium-ion electrochemical cell that contains a carbon anode with a copper current collector is believed to be susceptible to internal short-circuiting by either or both of two mechanism: (1) during overcharge, lithium dendrites can grow to form conductive anode-to-cathode-bridges; and (2) during over discharge, the copper current collector becomes dissolved and copper becomes deposited elsewhere, forming a conductive anode-to-cathode bridge. The literature shows that in experimental cells that have become short-circuited, lithium dendrites have been found to grow on the anode tabs (which are parts of the copper current collectors), and copper deposits have been found to grow in the separators adjacent to the anode tabs. The present invention also has applicability in studying the effects of electrolyte composition, variations in temperature, and pulse recharging sequences in incipient lithium dendrite formation.

Figure 7:
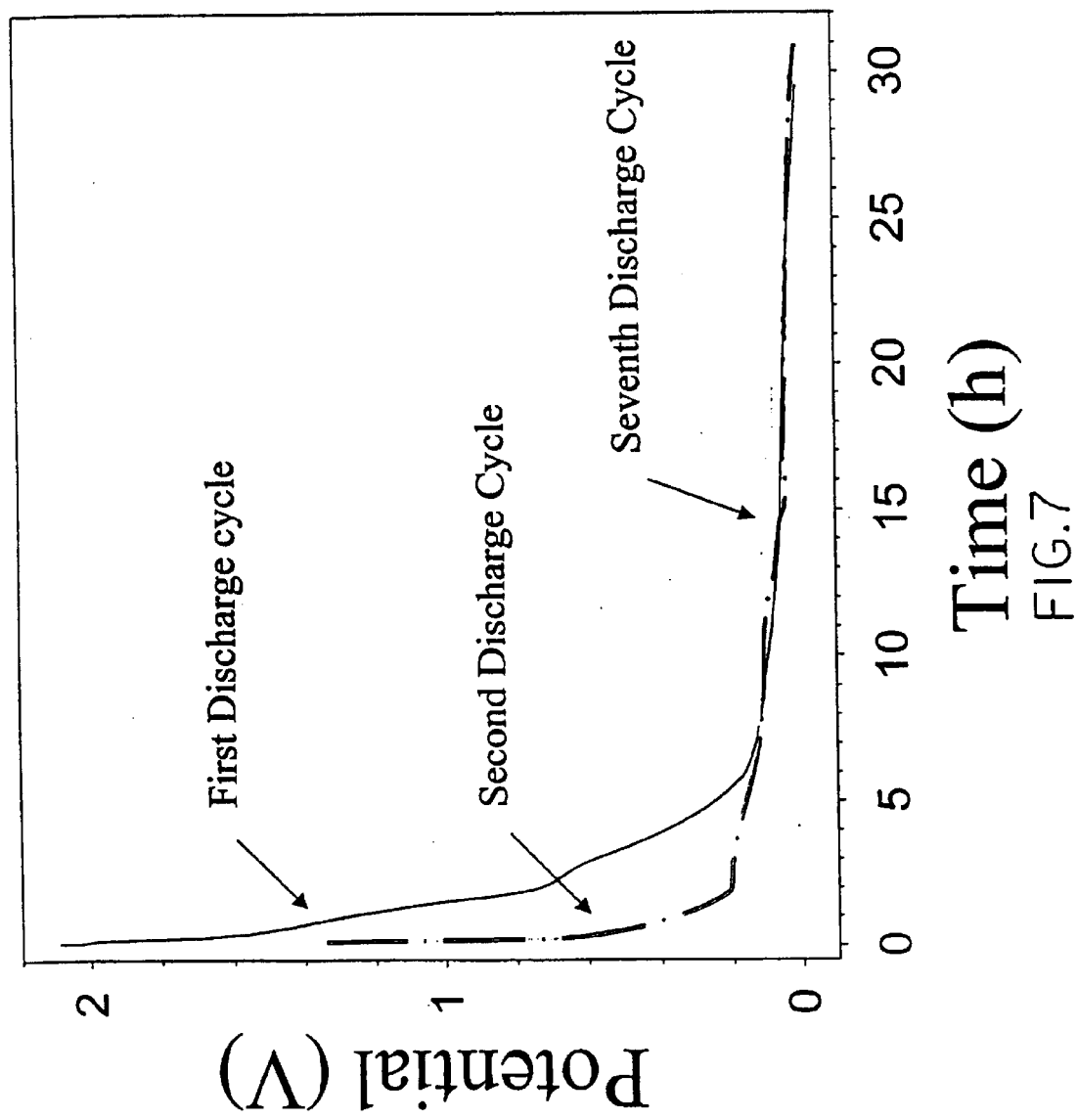
FIG. 7 is a graphic representation of the discharging cycles of an energy cell incorporating standard Li/carbon materials including a comparison of the differences between the cell potential (V) versus time in hours (h) for the first, second and seventh discharge cycles of the cell.

When lithium is immersed in non-aqueous solvent, reactions between lithium and the solvent occur quickly, leading to the formation of a film of reaction products in the lithium surface, called the solid electrolyte interphase (SEI). Also, when carbon is immersed in a non-aqueous solvent, a reaction occurs. In applicants' in situ experiments on batteries, it was determined that during the first discharge of a lithium/carbon cell, a fraction of the lithium atoms transferred electrochemically to the carbon will react irreversible with the carbon anode. FIG. 7 graphically shows the first, second and seventh discharge cycle of a Li/graphite cell where the variation of potential (V) with time is shown. During the first discharge cycle of the cell, the curve is different compared to the other two curves due to the formation of the SEI layer on the carbon. The capacity of the second discharge cycle is less than that of the first discharge because only the reversibly intercalated lithium, not that incorporated by the SEI, can be inserted into the carbon electrode.

Figure 8:
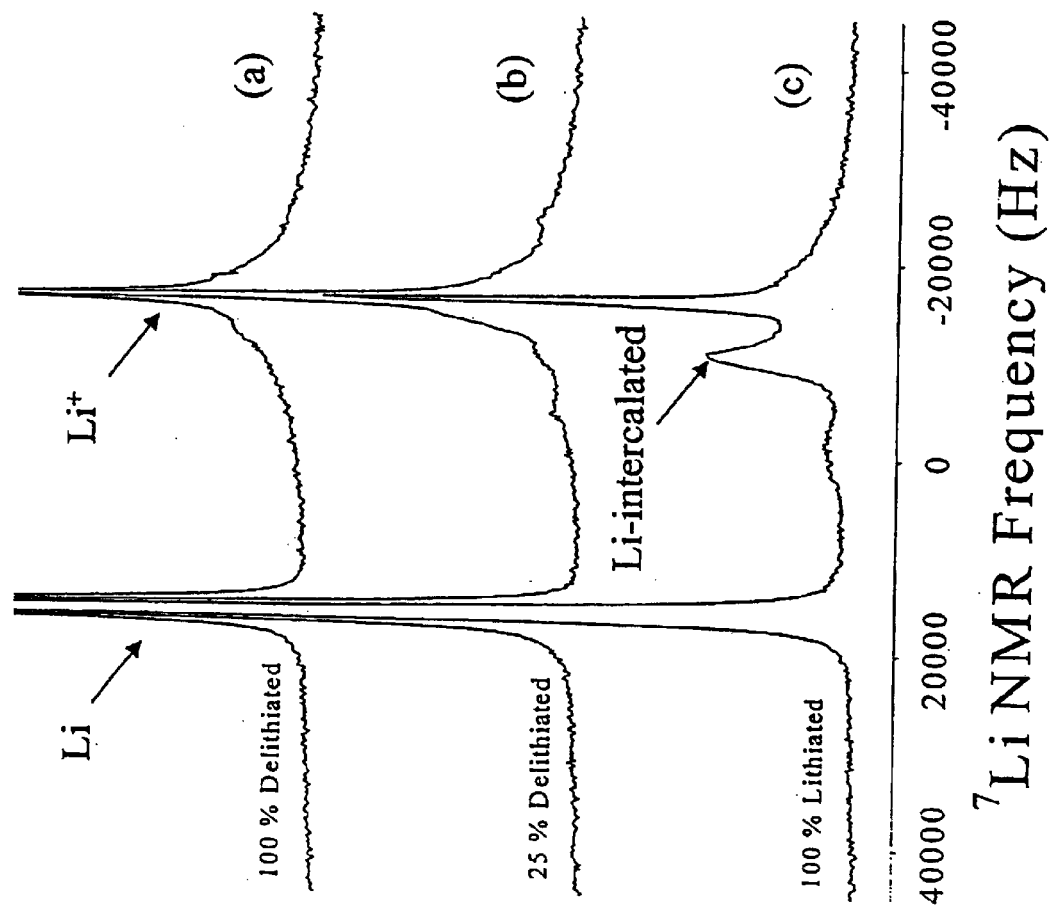
FIG. 8 is a graphic illustration of three Li-7 NMR spectra recorded in situ for three levels of lithium doping as measured by the video toroid cavity imager of the present invention.

The carbon structure greatly influences the intercalation of lithium. Much of the early work has been performed on Highly Ordered Pyrolytic Graphite (HOPG), which is highly graphitized. Unfortunately, very little fundamental work on intercalation in disordered carbons has been carrying out. Applicants have intercalated lithium into carbon laminates by using electrochemical methods. In applicants' investigations, they used a carbon electrode composed of a mixture of three powders: the active intercalation carbon, a flaky carbon material, and a polymeric binder material. Single pieces of this carbon material ⅝ inches diameter were cut and then used as electrodes. The charge and discharge curves of Li/carbon systems were measured and studied using NMR techniques. NMR spectra results obtained using the inventive video toroid cavity imager shown graphically in FIG. 8 reveal three peaks: the $Li^+$ ions from the residual electrolyte, the graphite intercalate ($LiC_6$), and the metallic lithium. The lithium speciation in the Li-7 NMR spectra of carbon electrodes allows for following the intercalation/extraction of lithium during cell cycling. These data should provide insights into the mechanism for lithium ion shuttling in carbon electrodes.

There has been work by industrial researchers on the effects of adding other elements to carbons, as additives. For example, carbons containing phosphorus, produced by pyrolysis of phosphorous containing polymers, showed a substantial increase in the voltage of cells. Another example involved a novel Ag-coated carbon anode material that had a surface-modified graphite designed-for the purpose of reducing the irreversible lithium capacity. Using the Ag-coated carbon material, applicants performed three experiments to measure the charging and discharging efficiency, to determine the profile of the charge/discharge cycle, and to measure the storage characteristics using the video toroid cavity imager of the present invention.

Lithium insertion and extraction was realized in a galvanostatic mode under a current load of 0.1 mA in the voltage limits from 1.5 to 0.0 volts. The charging and discharging functionality of Ag-coated carbon was investigated by using the compression coin cell battery imager device by recording NMR spectra. The loss of charge was measured in the subsequent cycles, and the total capacity significantly diminished from 2.2 mAh to 0.18 mAh after 8 cycles. The total capacity during the first cycle was very large, but an important amount was irreversibly consumed by the formation of the passive layer (SEI). The formation of the SEI primarily occurs when current is applied to the cell in the first discharge cycle.

Figure 9:
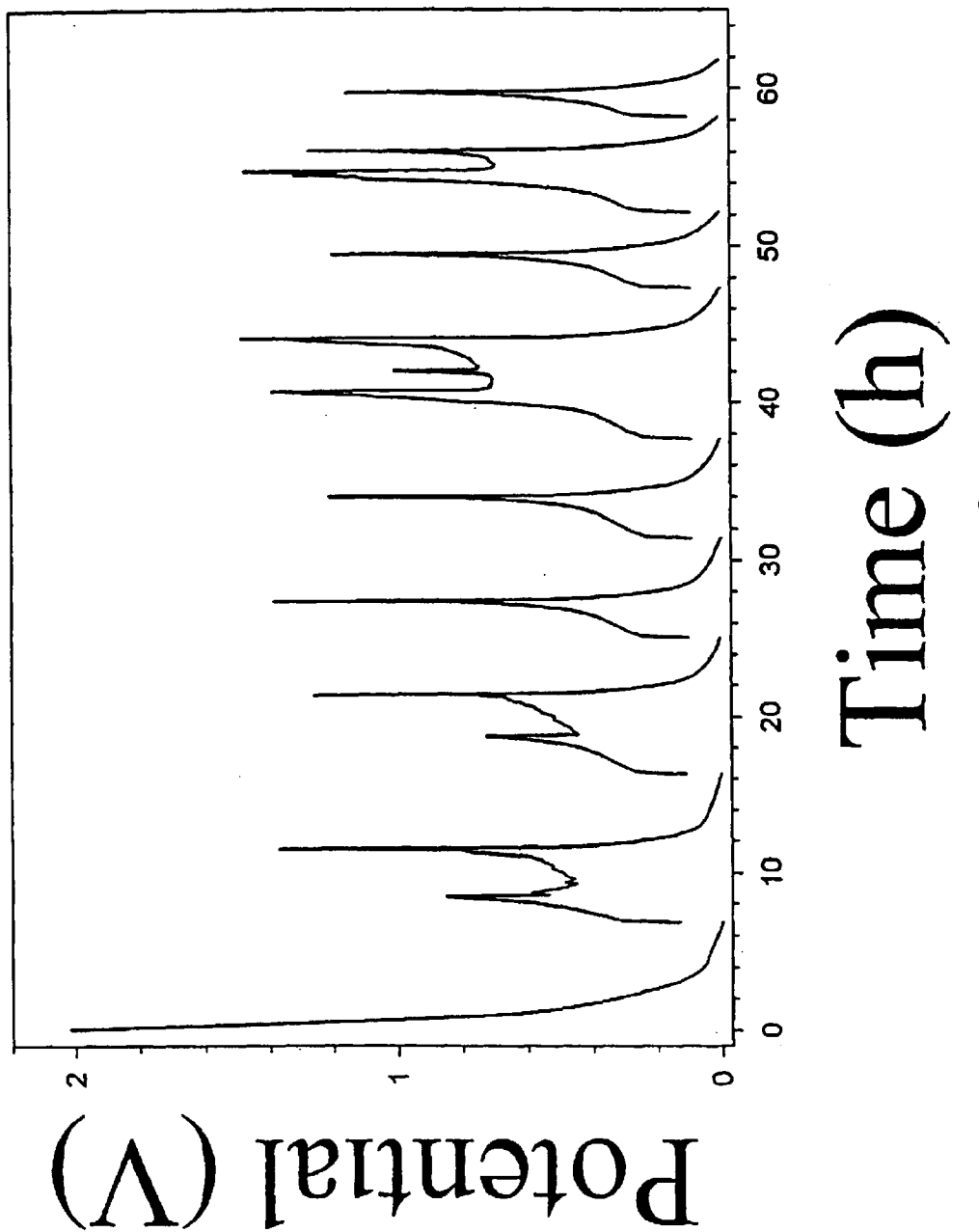
FIG. 9 is a graphic representation of the variation of potential (V) with time in hours (h) of an Ag/carbon cell as measured by the video toroid cavity imager of the present invention.

The Ag-coated carbon cell was cycled at 0.1 and –0.1 mA charge-discharge rate, respectively. Cycling was stopped when the capacity of the Ag-coated carbon dropped to 70% of the maximum initial value. FIG. 9 shows the cycling performance of the Ag-coated carbon cell. The cycles were irregular and became shorter following each cycle. The battery reached 1.5 volts and zero volts, but not uniformly. This was interpreted to mean that the cell did not have enough pressure to cause good contact among the carbon and lithium disks.

Figures 10, 11:
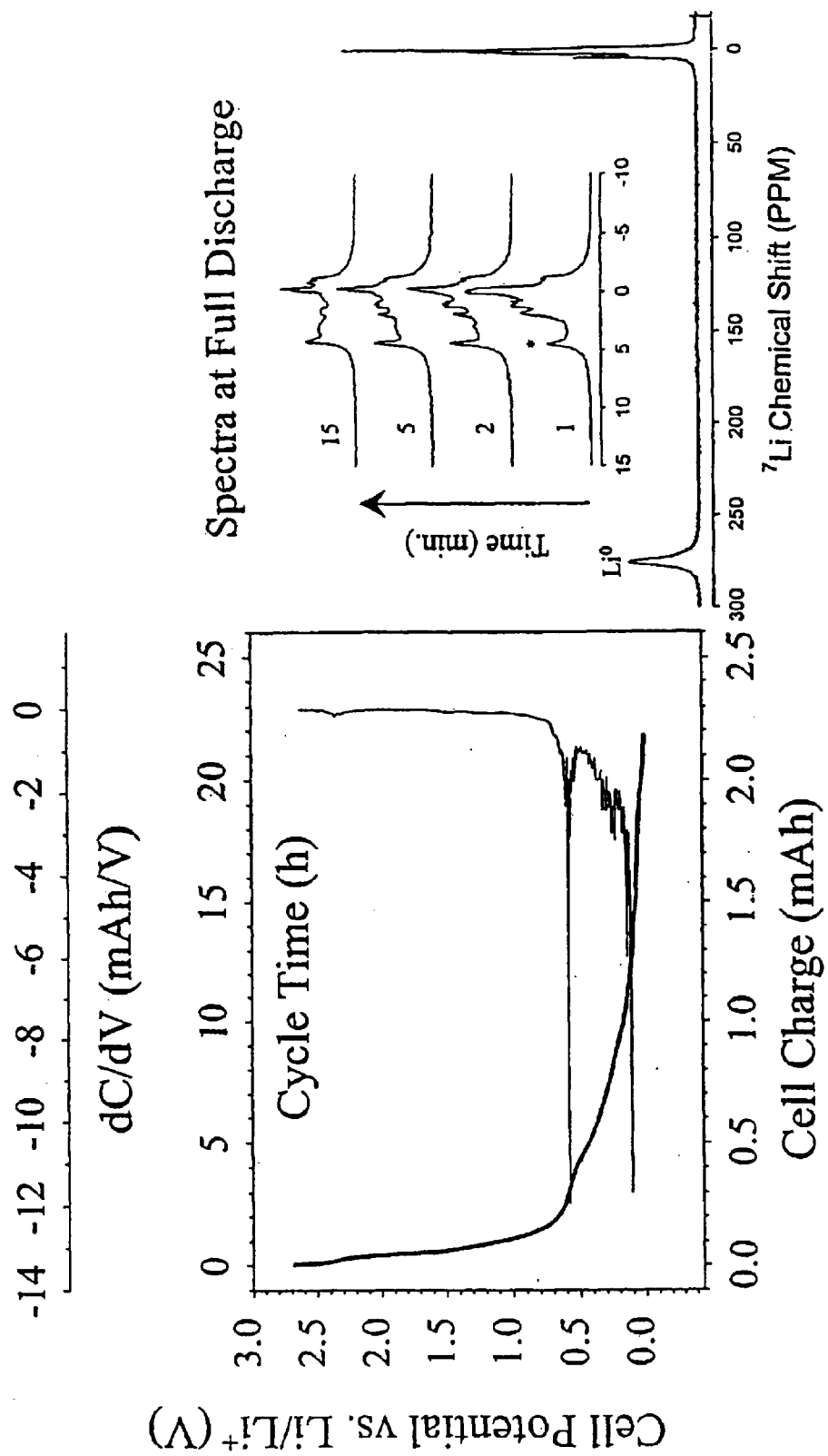
FIG. 10 is a graphic illustration of the variation of potential (V) with the cell charge (mAh) and with the derivative dC/dV(mAh/V) for the first discharge cycle of an electrochemical cell comprised of lithium in Ag-coated carbon as measured by the video toroid cavity Imager of the present invention.
FIG. 11 shows multiple Li-7 NMR spectra for the lithium in Ag-coated carbon material previously described as recorded after the first discharge cycle by the video toroid cavity imager of the present invention.

The galvanostatic discharge curve for Ag-coated carbon is shown in FIG. 10. This cell was discharged at the rate of 0.1 mA between 1.5 and 0.0 volts using the galvanostatic/potentiostat instrument. The differential dc/dv (mAhN) was calculated, and plotted against the cell potential. The plot clearly demarcated the voltage plateaus in the voltage vs. time (charge) curve. Two plateaus were observed for the first discharge cycle, as shown in FIG. 10. After the battery performed its first discharge cycle (2.7 to 0.0 volts) the galvanostat/potentiostat was disconnected and the battery was configured in the NMR probe. Several NMR spectra were recorded and are shown in FIG. 11. Applicants observed the lithium intercalate into the Ag-coated carbon, depicted by a peak near 5 ppm. NMR spectra were taken over periods of 1, 2, 5 and 15 minutes and showed that between 0 and 5 ppm changes in the spectra occurred. The 5-ppm peak did not change throughout the experiment, though the 0 ppm peak did. It is not known what is happening between 0 and 5 ppm.

Polymer electrolytes are needed that have sufficiently high conductivity (near 0° C.) for the portable electronics industry. The extraordinary development of "lithium-ion" batteries (using two intercalation electrodes) that started in the early 1990's and that now amounts to an $8 billion/year market, was mainly achieved using liquid electrolytes. The danger presented by these flammable liquids is not acceptable for consumer devices. Some of the advantages offered by safer solid electrolytes have led to a compromise: good mechanical properties with sufficient conductivities at commonly encountered temperatures. Polymer lithium-ion batteries are spreading rapidly in the electronics market, and might one day replace all existing battery systems based on liquid electrolytes. So far, the electroactive insertion materials used in commercial lithium-ion cells are based on carbon materials and lithium metal oxides. Large numbers of alternatives have been suggested. The inventors are working with a solid phthalocyanin-based compound (dilithium phthalocyanin, DiLiPc) in order to determine if it has high enough conductivity for lithium ions, and attempting to understand how the lithium intercalates and transports through DiLiPc.

Applicants have thus far performed three lithium intercalation experiments with DiLiPc. The electrochemical experiments were conducted only for the first discharge cycle. A galvanostat/coulometer model CS-1000 made by Elton Industries, inc. was used. It is designed for the small laboratory and is perfect for research and routine analyses. In a representative experiment, lithium insertion into DiLiPc was realized by setting the CS-1000 galvanostat/coulometer for a total charge transfer of 0.2 mAh under a current load of 1.0 mA. The CS-1000 coulometer does not allow voltage control, but the cell discharge voltage remained within the desired voltage limits of 0.0 to 1.5 volts. The process of lithiation was repeated a number of times for a total accumulation of several mAh; the time period for the whole lithium insertion was approximately 7 hours. According to the NMR spectra recorded, using the video toroid cavity imager of the present invention, the cell showed that the phthalocyanin is capable of hosting lithium. However, that lithium can be channeled from one electrode to another has not yet been demonstrated.

Applicants fabricated a ¾ inch-hole in the bottom part of the imager. This hole was slightly greater in diameter than the diameter of the lens on the electronic camera. The electronic camera is attached to the back of the cell, which in this case is the bottom part of the second-generation compression coin cell imager. The camera is interfaced to the computer for image processing and storage. The goal is to replace the copper principal detector element with indium tin oxide (ITO), which is a conductive transparent glass. The experiments applicants performed with the camera were conducted inside the magnet The copper principal detector in this case was replaced with a circular piece of glass 9/16 inch in diameter. Applicants set the cell up as before except that small pieces of tape were placed on the glass as objects for viewing. Video images of the pieces of tape were recorded to monitor the effect of the external field, $B_0$, on the electronic camera. The pictures that applicants took are shown in FIGS. 12a and 12b. These pictures of the pieces of tape on the circular piece of glass were taken at 0 and 30 minutes, and demonstrate that the video camera in the present invention is stable in the lower fringe field of the magnet, and likely will be stable in the homogeneous and strong region of the magnetic field.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A toroid cavity apparatus for in situ analyses of a sample through the use of nuclear magnetic resonance and optical inspection, said toroid cavity apparatus comprising:

a closed housing forming a toroid cavity, wherein said housing is disposed in an externally applied magnetic field $B_0$ and contains a sample to be analyzed;

a detector cell disposed within said toroid cavity and containing said sample;

an NMR spectrometer electrically coupled to said detector cell for producing an alternately energized and de-energized magnetic filed $B_1$ through said toroid cavity and within the sample for the spectroscopic analyses of the sample;

a laser or incandescent light source coupled to said toroid cavity for directing laser or white light, respectively, onto the sample; and a video camera coupled to said toroid cavity and focused on the sample for viewing and recording the appearance of the sample wherein said housing is cylindrical and includes a removable top cover plate disposed on a first end of said housing and a first aperture disposed on a second, opposed end of said housing, and wherein said video camera is disposed in said first aperture for viewing the sample in the toroid cavity.

2. The toroid cavity apparatus of claim 1 wherein said housing is comprised of plastic.

3. The toroid cavity apparatus of claim 1 wherein said housing includes a second aperture adapted to receive a fiber optic cable for transmitting laser or white light from said laser or incandescent light source, respectively, onto the sample.

4. The toroid cavity apparatus of claim 1 wherein said detector cell includes first and second electrodes disposed on opposed sides of the specimen, and a sealing member disposed about the sample and in contact with facing surfaces of said first and second electrodes.

5. The toroid cavity apparatus of claim 4 wherein said first electrode is optically transparent to permit photographing of the sample during in situ analyses.

6. The toroid cavity apparatus of claim 5 wherein said first electrode is comprised of indium tin oxide and said second electrode is comprised of copper.

7. The toroid cavity apparatus of claim 4 wherein said sealing member is an O-ring.

8. The toroid cavity apparatus of claim 7 wherein said O-ring is comprised of Teflon.

* * * * *